US006475816B1

(12) United States Patent
Riccobene et al.

(10) Patent No.: US 6,475,816 B1
(45) Date of Patent: Nov. 5, 2002

(54) METHOD FOR MEASURING SOURCE AND DRAIN JUNCTION DEPTH IN SILICON ON INSULATOR TECHNOLOGY

(75) Inventors: Concetta Riccobene, Mountain View, CA (US); Nga-Ching Wong, San Jose, CA (US); Tim Thurgate, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 47 days.

(21) Appl. No.: 09/781,435

(22) Filed: Feb. 13, 2001

(51) Int. Cl.[7] .................................... H01L 21/66
(52) U.S. Cl. .............................. 438/17; 438/18
(58) Field of Search ................. 324/765, 763, 324/769; 438/5, 10, 11, 14, 17, 18

(56) References Cited

U.S. PATENT DOCUMENTS 6,287,880 B1 * 9/2001 Erickson et al. .............. 438/17

OTHER PUBLICATIONS

Su et al., "Deep–Submicrometer Channel Design in Silicon–on–Insukator (SOI) MOSFET's", IEEE Electron Device Letters, vol. 15, No. 9, Sep. 1994, pp. 366–369.*

* cited by examiner

Primary Examiner—Michael Sherry
Assistant Examiner—Evan Pert

(57) ABSTRACT

A method is provided for accurately determining the junction depth of silicon-on-insulator (SOI) devices. Embodiments include determining the junction depth in an SOI device under inspection by measuring the threshold voltage of its "bottom transistor" formed by its source and drain regions together with its substrate acting as a gate. The threshold voltage of the bottom transistor of an SOI device varies with its junction depth in a predictable way. Thus, the junction depth of the inspected device is determined by comparing its bottom transistor threshold voltage with the bottom transistor threshold voltage of corresponding reference SOI devices of known junction depth to find a match. For example, simulated SOI devices with the same characteristics as the inspected device, whose junction depth and bottom transistor threshold voltages have been previously calculated, are used as a "reference library". If the bottom transistor threshold voltage of the inspected device has about the same value as that of a particular one of the reference devices, then the inspected device has the junction depth of that particular reference device. Thus, junction depth of the inspected SOI device is accurately determined by a simple electrical measurement of threshold voltage.

9 Claims, 7 Drawing Sheets

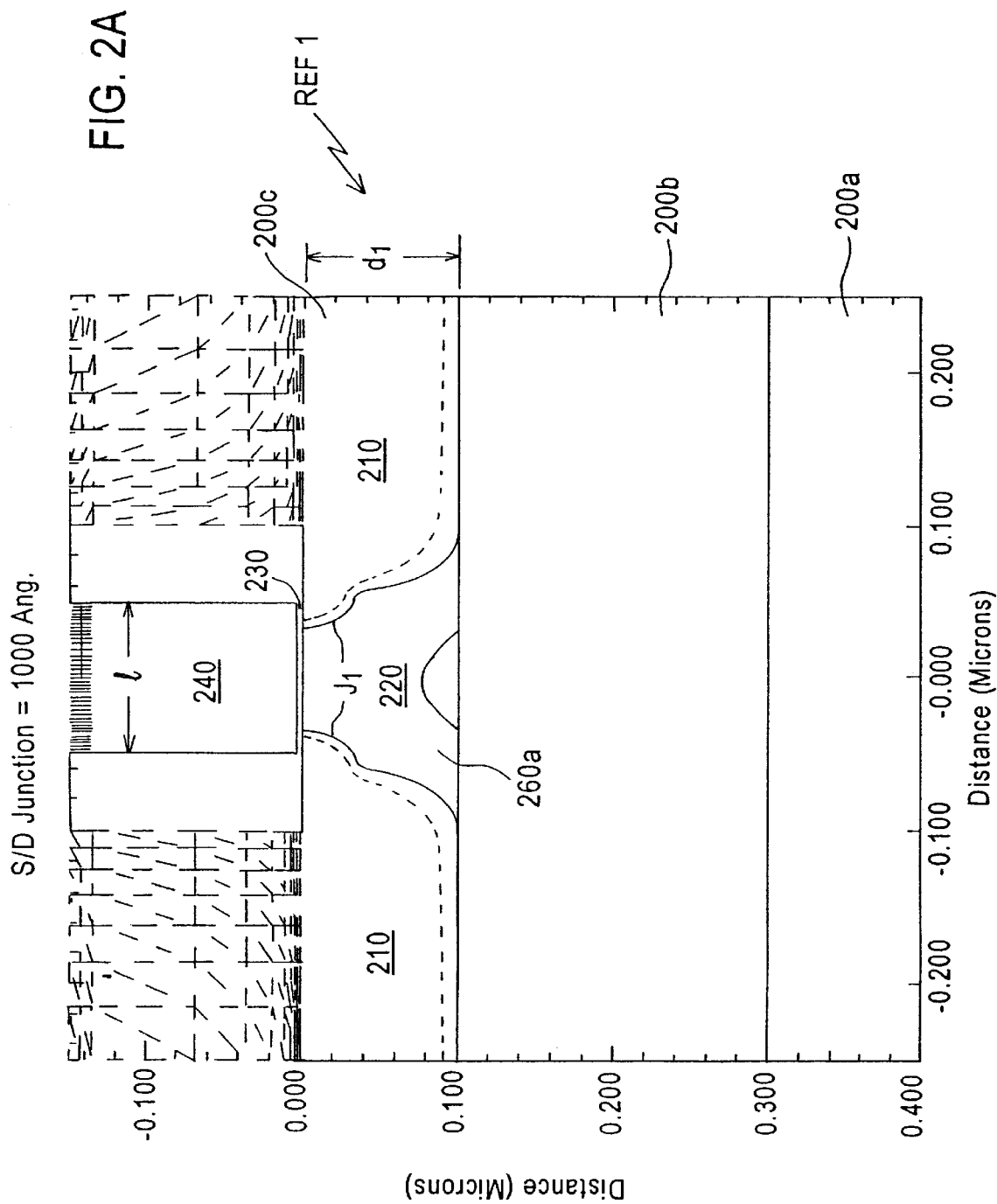

METHOD FOR MEASURING SOURCE AND DRAIN JUNCTION DEPTH IN SILICON ON INSULATOR TECHNOLOGY

FIELD OF THE INVENTION

The present invention relates to a method for measuring the physical characteristics of a semiconductor device. The present invention has particular applicability in manufacturing silicon-on-insulator devices.

BACKGROUND ART

In conventional silicon-on-insulator (SOI) technology, a metal oxide semiconductor (MOS) device is formed on a substrate comprising a bottom silicon layer, an insulating layer (referred to as a "BOX layer"), such as a silicon dioxide layer, on the bottom silicon layer, and an upper silicon layer formed on the BOX layer. The MOS device has a source region and a drain region, separated by a channel region, formed in the upper silicon layer, a gate oxide layer formed on the main surface of the upper silicon layer, and a conductive gate, typically of polysilicon, formed on the gate oxide layer. The source and drain regions are typically formed by ion implantation of impurities, and each have a junction with the upper silicon layer.

The location of the source/drain junctions below the main surface of the upper silicon layer, referred to as the "source/drain junction depth", is important to the characterization of a device. In general, the shallower the junction depth, the better the performance of a device. For example, in SOI technology, the junction depth determines the "floating body effect" of the device, which is an important indicator of how well a device will perform. Therefore, junction depth needs to be monitored for process control and quality control purposes.

Conventional methods for measuring junction depth include spreading resistance profiling (SRP), which determines the electrically active concentration of species forming the source/drain junctions, and secondary ion mass spectroscopy (SIMS), which measures the chemical concentration of a dopant. Disadvantageously, both the SRP and SIMS measurements tend to be inaccurate, especially in the proximity of a silicon/silicon dioxide interface. This is problematic when measuring SOI junction depths, because SOI source/drain junctions typically occur close to the bottom of the upper silicon layer, at or near the interface with the BOX layer. Thus, SRP and SIMS techniques have difficulty correctly locating source/drain junctions in SOI devices.

There exists a need for a methodology for accurately locating source/drain junctions in SOI devices.

SUMMARY OF THE INVENTION

An advantage of the present invention is a technique for accurately determining the source/drain junction locations in SOI devices based on measurements of electrical characteristics of the devices.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method for determining a source/drain junction depth of an inspected semiconductor device formed on a substrate, the substrate comprising a bottom semiconductor layer, an insulating layer on the bottom semiconductor layer, and an upper semiconductor layer, the inspected device having a source region and a drain region formed in the upper semiconductor layer, the method comprising measuring a threshold voltage of a bottom transistor comprising the source region, the drain region and the substrate; and determining the source/drain junction depth of the inspected device based on the threshold voltage of the bottom transistor.

Another aspect of the present invention is a method for determining a source/drain junction depth of an inspected semiconductor device formed on a substrate, the substrate comprising a bottom semiconductor layer, an insulating layer on the bottom semiconductor layer, and an upper semiconductor layer, the inspected device having a source region and a drain region formed in the upper semiconductor layer. The method comprises measuring a threshold voltage of a bottom transistor comprising the source region, the drain region and the substrate by grounding the source and applying a low voltage to the drain, and applying a test voltage varing from about zero to at least the threshold voltage, wherein the threshold voltage comprises a voltage that corresponds to formation of a depletion region between the source and drain regions. The threshold voltages of bottom transistors of a plurality of reference devices are also determined, the reference devices each having a different known source/drain junction depth and having physical characteristics corresponding to those of the inspected device; the threshold voltage of the inspected device bottom transistor is compared to the threshold voltages of the reference device bottom transistors; and the source/drain junction depth of the inspected device is determined to be about the same as the source/drain junction depth of one of the reference devices when the threshold voltage of the inspected device bottom transistor is about equal to the threshold voltage of the one of the reference devices bottom transistor.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIGS. 2A–2D are cross-sectional views of reference devices used in practicing the present invention.

DESCRIPTION OF THE INVENTION

Conventional methodologies for determining the source/drain junction location of SOI devices, such as SRP and SIMS, do not yield accurate results. The present invention addresses and solves this problem stemming from conventional inaccurate techniques for measuring junction depth.

The methodology of the present invention is based on the fact that different source/drain junction depths give rise to different depletion layers and, in turn, different charge layers in the channel region. This charge variation causes a threshold voltage shift for a "bottom transistor" formed by the source and drain regions of an SOI device together with the substrate acting as a gate. According to the methodology of the present invention, the junction depth in an SOI device under inspection is determined by measuring the threshold voltage of its bottom transistor. Since the threshold voltage of the bottom transistor of an SOI device varies with its junction depth in a predictable way, the junction depth of the inspected device can be determined by comparing its bottom transistor threshold voltage with the bottom transistor threshold voltage of corresponding reference SOI devices of known junction depth to find a match. For example, simulated SOI devices with the same characteristics as the inspected device whose junction depth and bottom transistor threshold voltages have been previously calculated are used as a "reference library". If the bottom transistor threshold voltage of the inspected device has about the same value as that of a particular one of the reference devices, then the inspected device has the junction depth of that particular reference device. Thus, junction depth of the inspected SOI device is accurately determined by a simple electrical measurement of threshold voltage.

Figure 1:
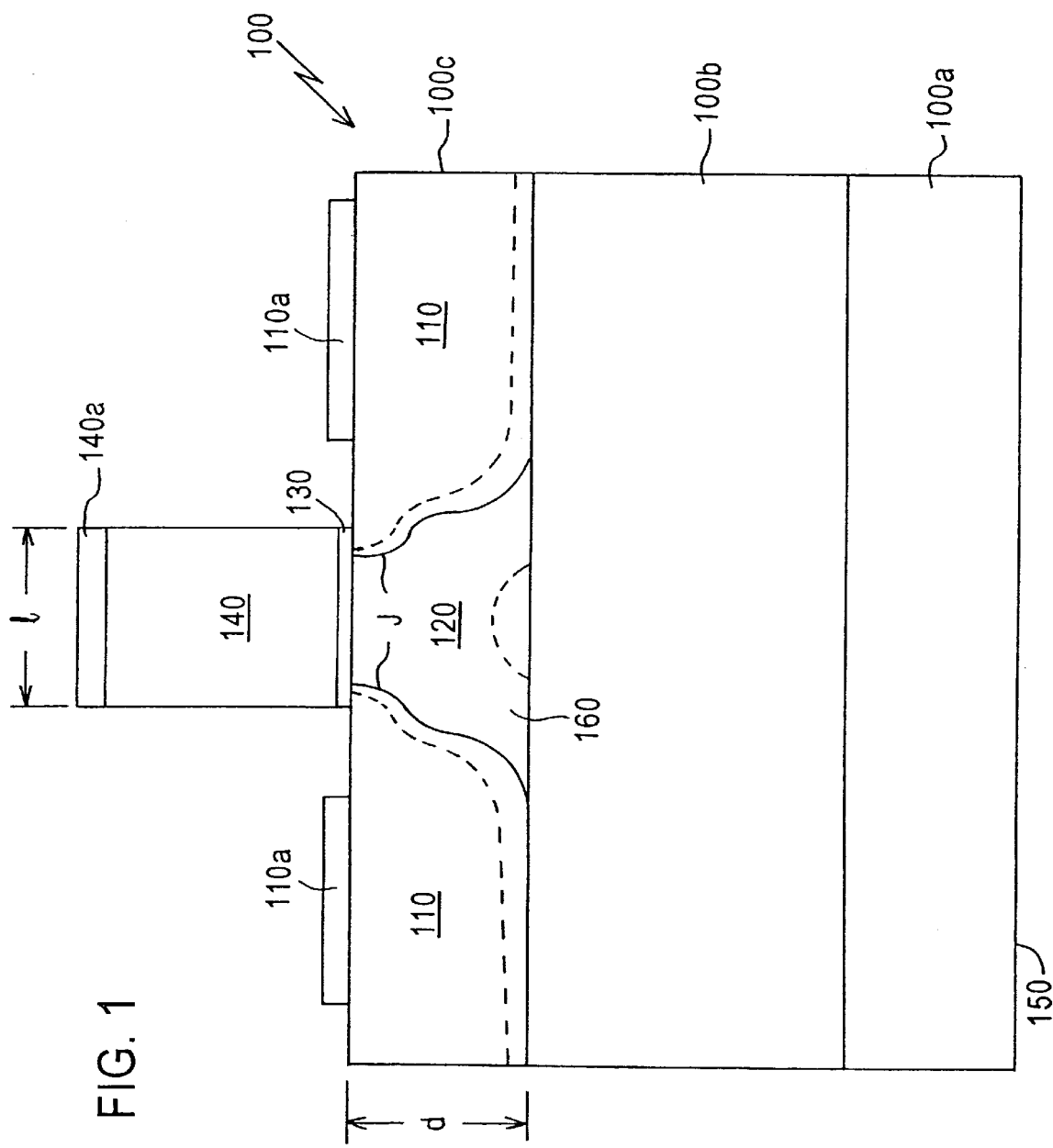
FIG. 1 is a cross-sectional view of a semiconductor device whose junction depth is to be determined using the present methodology.
Figure 2B:
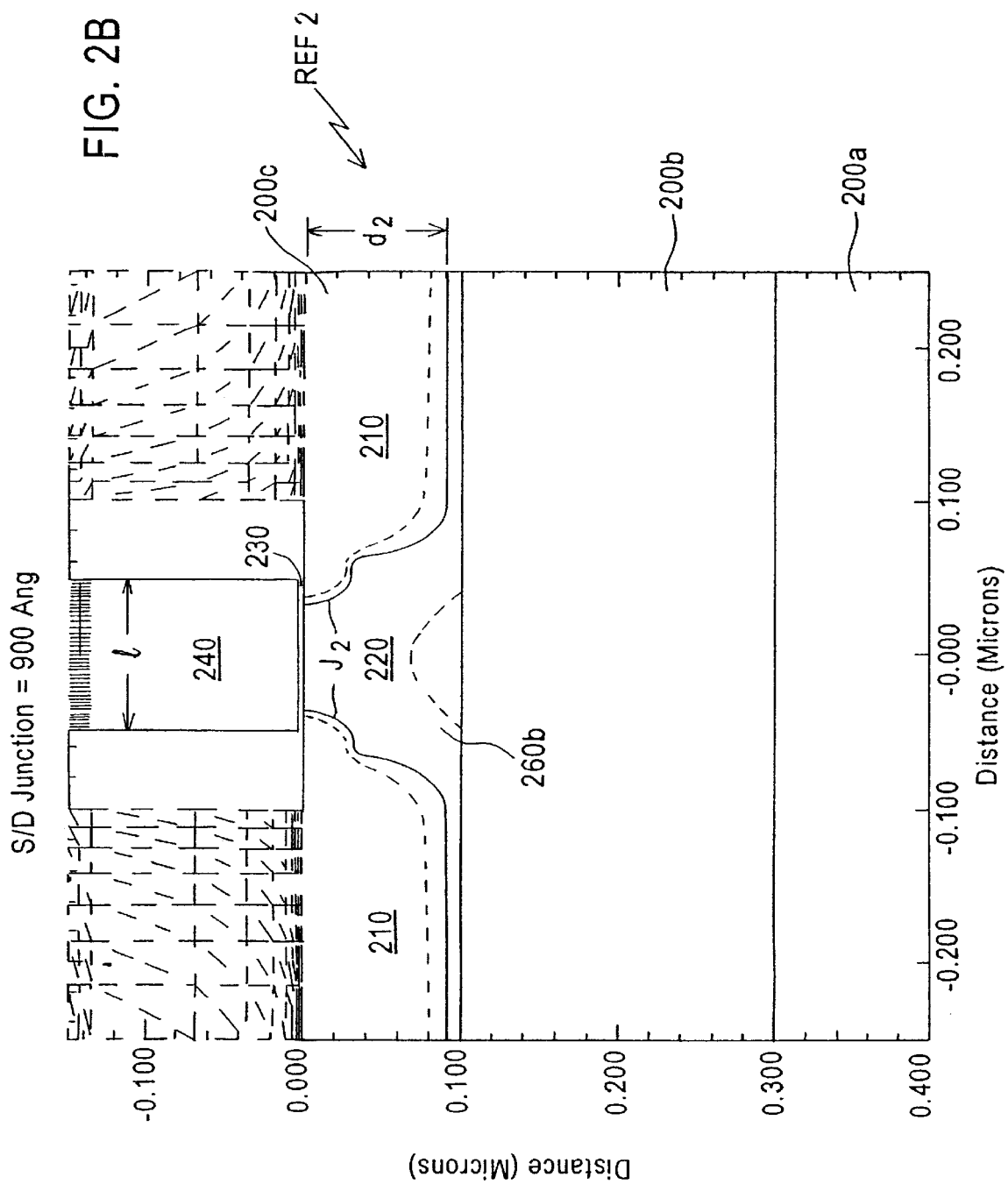
Figure 2C:
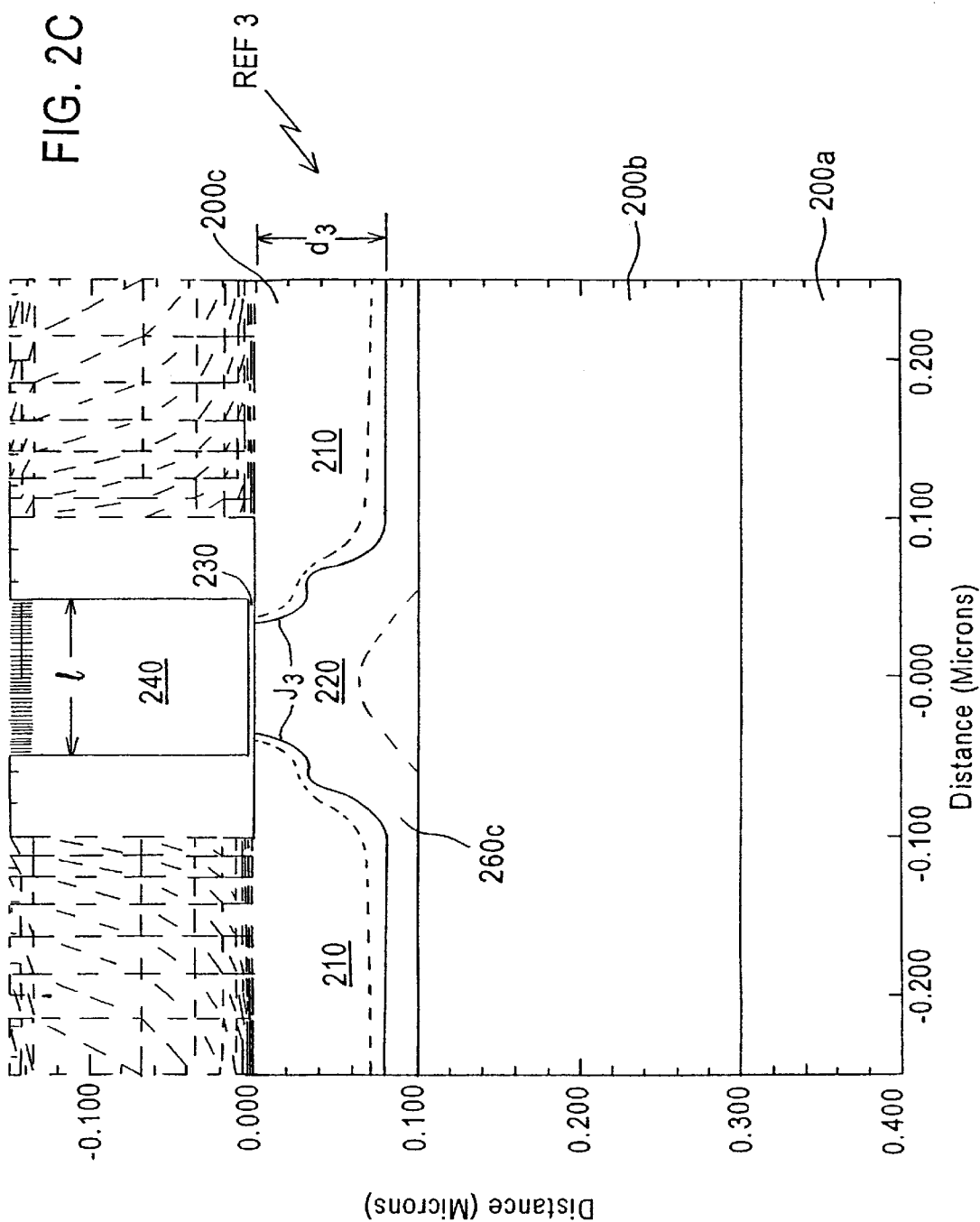
Figure 2D:
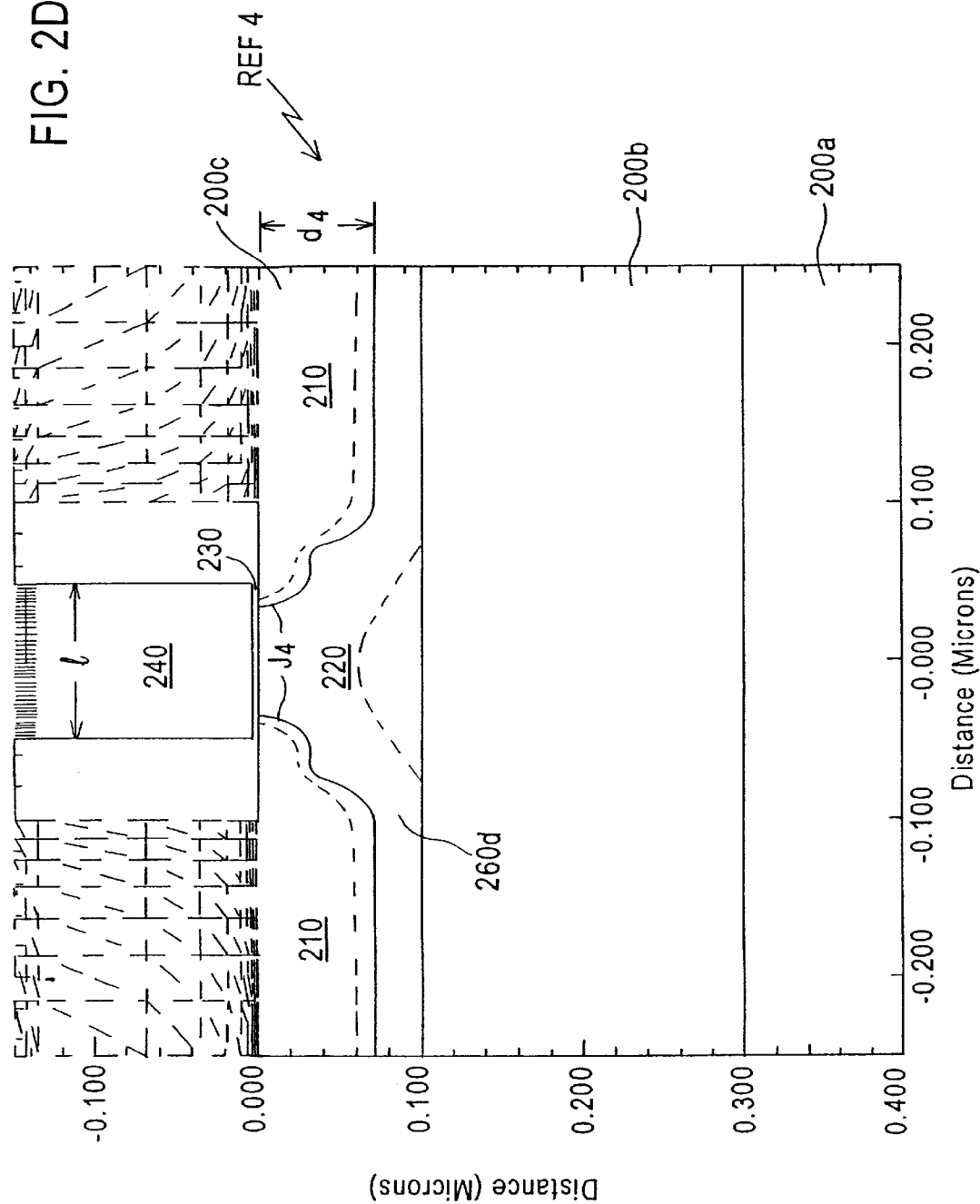

The methodology of the present invention will now be described in detail. Referring to FIG. 1, a typical SOI device 100 whose junction depth is to be determined comprises a thick bottom silicon layer 100a, an insulating BOX layer 100b, such as a silicon dioxide layer about 2000 Å thick, on bottom silicon layer 100a, and an upper silicon layer 100c about 1000 Å thick formed on BOX layer 100b. Device 100 has source and drain regions 110 and a channel region 120 formed in upper silicon layer 100c. A gate oxide layer 130 is formed on the main surface of upper silicon layer 100c, and a conductive gate 140, typically of polysilicon, is formed on gate oxide layer 130. Gate 140 has a gate length l of about 0.1 μm. Conductive contacts 110a, 140a, such as metal silicide contacts, are typically formed on source and drain regions 110 and gate 140, and a substrate bottom contact 150 is formed on the bottom of silicon region 100a. Source and drain regions 110 each have a junction J with upper silicon layer 110c. Junctions J have a depth d below the main surface of upper silicon layer 110c. Junction depth d is about 1000 Å; that is, junctions J touch the interface of BOX layer 100b. The inventive method is carried out on a completed SOI device such as device 100; therefore, junction depth d is not initially known.

Employing the present methodology, the threshold voltage is measured for a bottom transistor formed by source and drain regions 110 of device 100, with bottom silicon layer 100a and BOX layer 100b acting as a gate. To accomplish this theshold voltage measurement, source region 110 is grounded, a very low voltage (e.g., about 0.05 volts) is placed on drain region 110, and a voltage is applied to substrate bottom contact 150. Alternatively, bottom contact 150 can be grounded to reduce bottom silicon layer 100a and BOX layer 100b to effectively gain access to active regions 110 at upper silicon layer 100c. The goal is to control the top structure comprising source/drain regions 110 and channel region 120 using bottom contact 150. Bottom contact 150 is typically not useful in SOI technology, since devices are formed on the top of the substrate with BOX layer 100b between, but bottom contact 150 is always provided nonetheless.

The voltage applied to bottom contact 150 is varied from zero to a relatively high voltage (e.g., up to about 15 volts or more). The voltage applied at bottom contact 150 modulates the charge in channel region 120 to form a depletion layer 160 between the dotted lines. The threshold voltage of the bottom transistor can then be determined in a conventional manner, such as described in detail below. The bottom transistor theshold voltage is relatively high due to the thickness of BOX layer 100b.

To determine junction depth d of SOI device under inspection 100 knowing its bottom transistor threshold voltage, threshold voltages are determined for bottom transistors of a plurality of reference devices, each having a different known source/drain junction depth. The threshold voltage of inspected device 100 is then compared to those of the reference devices. The reference devices must have physical characteristics, such as gate length and substrate layer thicknesses, corresponding to those of the inspected device. The reference devices may be simulations or may be actual devices.

Examples of such reference devices are shown in FIGS. 2A–2D, wherein simulated SOI devices REF1–REF4 are illustrated having different junction depths $d_1$–$d_4$ ranging from about 1000 Å to about 700 Å, respectively, and resultingly different junction locations $J_1$–$J_4$, but otherwise identical physical characteristics, such as the thickness of substrate layers 200a–200c, doping of source/drain regions 210 and channel regions 220, thickness of gate oxide layers 230, size of gates 240 (e.g., a gate length l), etc. The physical characteristics of reference devices REF1–REF4 also correspond to those of inspected device 100 (e.g., the same gate length l). It can be seen that different junction depths $d_1$–$d_4$ result in differently-shaped depletion layers 260a–260d formed in channel region 220 when the bottom transistor is operated. The bottom transistor threshold voltage will therefore also vary corresponding to the junction depth $d_1$–$d_4$. As a result, a reference device having about the same bottom transistor threshold voltage as inspected device 100 will also have about the same junction depth as inspected device 100.

Figure 3:
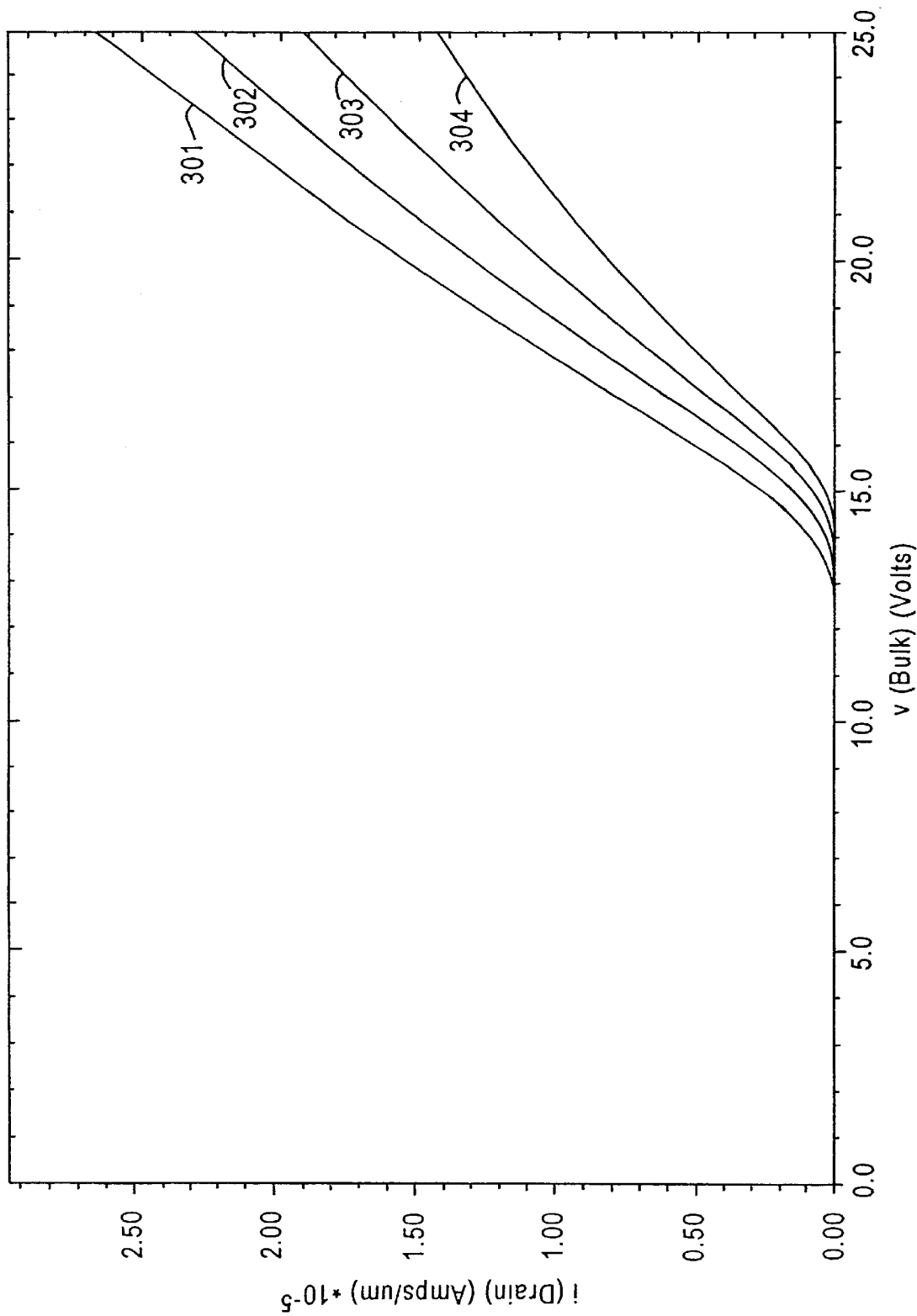
FIGS. 3 and 4 are graphical representations of electrical characteristics of the reference devices of FIGS. 2A–2D.
Figure 4:
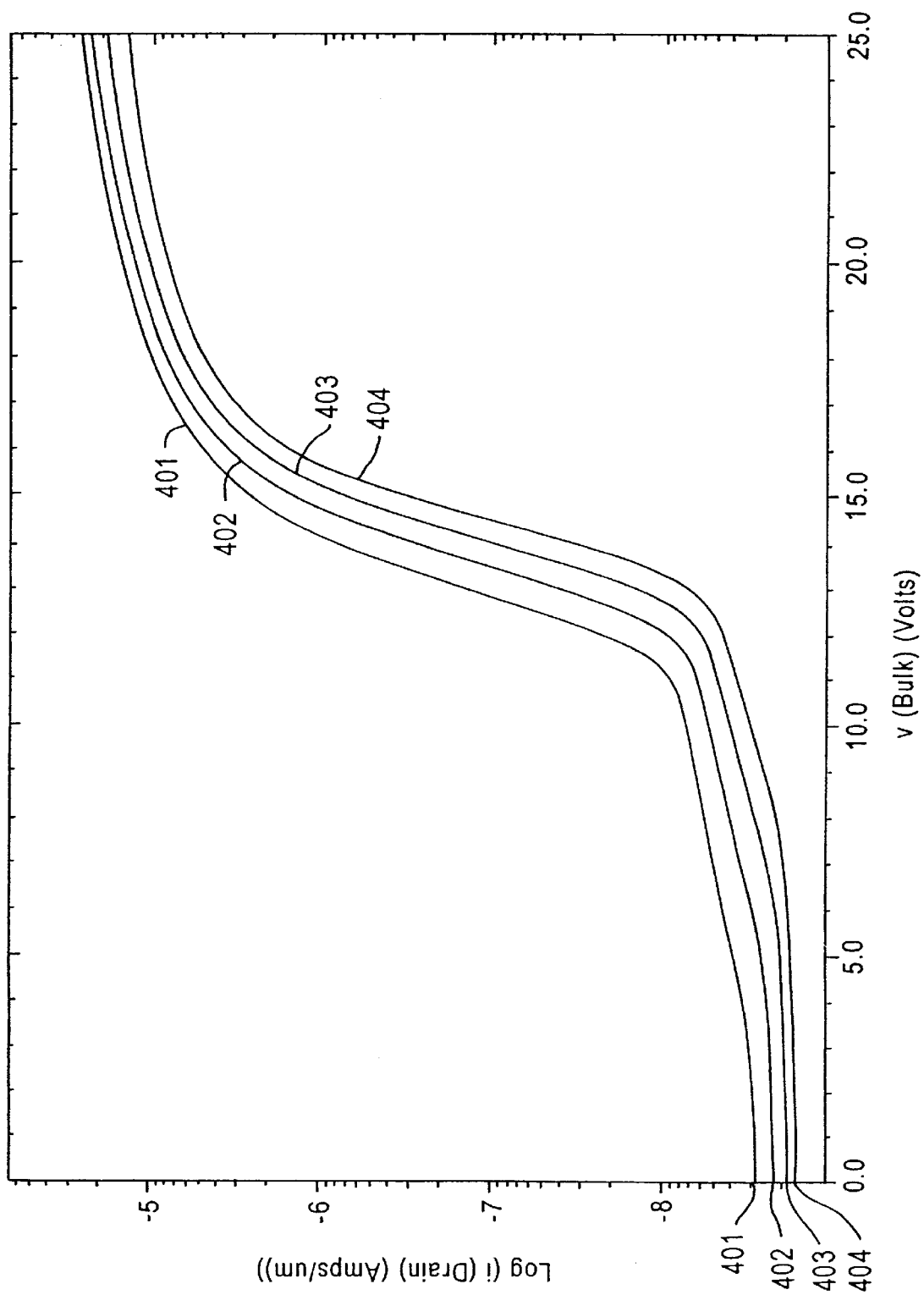

FIG. 3 is a plot of the voltage applied to bottom layer 200a "v(bulk)" versus drain current of the bottom transistor "i(drain)" for each of the SOI devices REF1–REF4 of FIGS. 2A–2D. The resulting curves 301–304, which correspond to devices REF1–REF4, respectively, show that differing junction depths $d_1$–$d_4$ create a shift in the bottom transistor threshold voltage. FIG. 4 contains the same information as FIG. 3, except that voltage applied to bottom layer 200a is plotted versus the log of the drain current, to yield curves 401–404 for each of devices REF1–REF4, respectively. The bottom transistor threshold voltage can be measured as the voltage at a given arbitrarily chosen drain current, or at the intersection of the tangent of the curve (e.g., curve 301–304) where the curve's slope is highest with the x-axis. Of course, regardless of how the bottom transistor threshold voltage of the reference devices is measured, one skilled in the art will recognize that the bottom transistor threshold voltage of inspected device 100 must be measured in a corresponding manner (e.g., via a plot as in FIGS. 3 or 4).

The threshold voltage of the inspected device 100's bottom transistor is compared to the threshold voltages of the reference devices' (REF1–REF4) bottom transistors. When a match is found; that is, when the threshold voltage of the inspected device bottom transistor is about equal to the threshold voltage of one of the reference devices bottom transistor, it is determined that the source/drain junction depth of inspected device 100 is about the same as the source/drain junction depth of the matching reference device.

Thus, the present invention enables the junction depth of an SOI device to be quickly and accurately determined with a simple electrical test to threshold voltage. Such junction depth information can then be used for process control and/or design work to improve yield and improve the performance of subsequently manufactured devices.

The present invention is applicable to the manufacture of various types of semiconductor devices, particularly high-density semiconductor devices having a design rule of about $0.18\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method for determining a source/drain junction depth of an inspected semiconductor device formed on a substrate, the substrate comprising a bottom semiconductor layer, an insulating layer on the bottom semiconductor layer, and an upper semiconductor layer, the inspected device having a source region and a drain region formed in the upper semiconductor layer, the method comprising:
   measuring a threshold voltage of a bottom transistor comprising the source region, the drain region and the substrate; and
   determining the source/drain junction depth of the inspected device based on the threshold voltage of the bottom transistor.

2. The method of claim 1, wherein measuring the threshold voltage of the bottom transistor comprises applying a test voltage to the bottom semiconductor layer.

3. The method of claim 2, comprising grounding the source and applying a low voltage to the drain while applying the test voltage.

4. The method of claim 3, wherein applying the test voltage comprises varying the test voltage from about zero to at least the threshold voltage, wherein the threshold voltage comprises a voltage that corresponds to formation of a depletion layer between the source and drain regions.

5. The method of claim 1, wherein measuring the threshold voltage of the bottom transistor comprises grounding the bottom semiconductor layer.

6. The method of claim 1, wherein determining the source/drain junction depth of the inspected device comprises:
   determining threshold voltages of bottom transistors of a plurality of reference devices, the reference devices each having a different known source/drain junction depth and having physical characteristics corresponding to those of the inspected device; and
   comparing the threshold voltage of the inspected device bottom transistor to the threshold voltages of the reference device bottom transistors.

7. The method of claim 6, comprising determining that the source/drain junction depth of the inspected device is about the same as the source/drain junction depth of one of the reference devices when the threshold voltage of the inspected device bottom transistor is about equal to the threshold voltage of the one of the reference devices bottom transistor.

8. The method of claim 6, comprising simulating the reference devices.

9. A method for determining a source/drain junction depth of an inspected semiconductor device formed on a substrate, the substrate comprising a bottom semiconductor layer, an insulating layer on the bottom semiconductor layer, and an upper semiconductor layer, the inspected device having a source region and a drain region formed in the upper semiconductor layer, the method comprising:
   measuring a threshold voltage of a bottom transistor comprising the source region, the drain region and the substrate by:
      grounding the source and applying a low voltage to the drain; and
      applying a test voltage varing from about zero to at least the threshold voltage, wherein the threshold voltage comprises a voltage that corresponds to formation of a depletion region between the source and drain regions;
   determining threshold voltages of bottom transistors of a plurality of reference devices, the reference devices each having a different known source/drain junction depth and having physical characteristics corresponding to those of the inspected device;
   comparing the threshold voltage of the inspected device bottom transistor to the threshold voltages of the reference device bottom transistors; and
   determining that the source/drain junction depth of the inspected device is about the same as the source/drain junction depth of one of the reference devices when the threshold voltage of the inspected device bottom transistor is about equal to the threshold voltage of the one of the reference devices bottom transistor.

* * * * *